(12) United States Patent
Kim et al.

(10) Patent No.: US 11,600,322 B2
(45) Date of Patent: Mar. 7, 2023

(54) SEMICONDUCTOR MEMORY DEVICE AND METHOD OF OPERATING THE SAME

(71) Applicant: SK hynix Inc., Icheon-si (KR)

(72) Inventors: Byoung Young Kim, Icheon-si (KR); Jong Woo Kim, Icheon-si (KR); Young Cheol Shin, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 2 days.

(21) Appl. No.: 17/227,907

(22) Filed: Apr. 12, 2021

(65) Prior Publication Data

US 2022/0115062 A1    Apr. 14, 2022

(30) Foreign Application Priority Data

Oct. 12, 2020    (KR) .................. 10-2020-0131457

(51) Int. Cl.
  *G11C 11/34*    (2006.01)
  *G11C 11/56*    (2006.01)
  *G11C 16/34*    (2006.01)
  *G11C 16/10*    (2006.01)
  *G11C 16/04*    (2006.01)

(52) U.S. Cl.
  CPC ...... *G11C 11/5628* (2013.01); *G11C 11/5671* (2013.01); *G11C 16/0483* (2013.01); *G11C 16/10* (2013.01); *G11C 16/3459* (2013.01)

(58) Field of Classification Search
  CPC . G11C 16/10; G11C 11/5671; G11C 16/0483; G11C 16/3459
  See application file for complete search history.

(56) References Cited

U.S. PATENT DOCUMENTS

| | | | | |
|---|---|---|---|---|
| 2005/0248993 | A1* | 11/2005 | Lee | G11C 16/344 365/185.29 |
| 2008/0239806 | A1* | 10/2008 | Moschiano | G11C 11/5628 365/185.23 |
| 2011/0216600 | A1* | 9/2011 | Goda | G11C 16/12 365/185.19 |

FOREIGN PATENT DOCUMENTS

| | | |
|---|---|---|
| KR | 1020100013950 A | 2/2010 |
| KR | 1020100106767 A | 10/2010 |

* cited by examiner

*Primary Examiner* — Uyen Smet
(74) *Attorney, Agent, or Firm* — William Park & Associates Ltd.

(57) ABSTRACT

A semiconductor memory device includes a memory block including a plurality of memory cells programmed to a plurality of program states during a program operation, a voltage generator to generate and apply a program voltage and a select line voltage to the memory block during the program operation, and a read and write circuit to temporarily store program data during the program operation and control a potential of bit lines of the memory block based on the temporarily stored program data. The voltage generator generates the select line voltage as a first select line voltage during a first program operation on some program states among the plurality of program states, or as a second select line voltage for which a potential is lower than a potential of the first select line voltage during a second program operation on remaining program states among the plurality of program states.

20 Claims, 12 Drawing Sheets

SEMICONDUCTOR MEMORY DEVICE AND METHOD OF OPERATING THE SAME

CROSS-REFERENCE TO RELATED APPLICATION

The present application claims priority under 35 U.S.C. § 119(a) to Korean patent application number 10-2020-0131457, filed on Oct. 12, 2020, in the Korean Intellectual Property Office, the entire disclosure of which is incorporated herein by reference.

BACKGROUND

1. Technical Field

The present disclosure relates to an electronic device, and more particularly, to a semiconductor memory device and a method of operating the semiconductor memory device.

2. Related Art

The current paradigm for computing is trending toward ubiquitous computing in that computer systems are accessible virtually anywhere at any time. For example, the use of portable electronic devices such as mobile phones, tablets, and notebook computers is rapidly increasing. Such portable electronic devices generally use memory systems that include a semiconductor memory device, that is, a data storage device. The data storage device is used as a main storage device or an auxiliary storage device of the portable electronic devices.

A data storage device using a semiconductor memory device has advantages in that stability and durability are excellent because there is no mechanical driver, access speeds for information is very fast, and power consumption is low. As an example of a memory system having such advantages, a data storage device may include a universal serial bus (USB) memory device, a memory card having various interfaces, a solid state drive (SSD), and the like.

A semiconductor memory device is generally classified as a volatile memory device or a nonvolatile memory device.

Read and write speeds of a nonvolatile memory device are relatively slow, however, nonvolatile memory devices maintain stored data even when a supply of power is interrupted. Therefore, nonvolatile memory devices are used to store data that needs to be maintained in the absence of power. Nonvolatile memory devices may include read only memory (ROM), mask ROM (MROM), programmable ROM (PROM), erasable programmable ROM (EPROM), electrically erasable programmable ROM (EEPROM), flash memory, phase change random access memory (PRAM), magnetic RAM (MRAM), resistive RAM (RRAM), ferroelectric RAM (FRAM), and the like. The flash memory is divided into NOR and NAND types.

SUMMARY

An embodiment of the present disclosure is directed to a semiconductor memory device capable of improving a program disturb phenomenon by controlling a drain select line voltage during a program operation, and a method of operating the same.

A semiconductor memory device according to an embodiment of the present disclosure includes a memory block including a plurality of memory cells programmable to a plurality of program states during a program operation, a voltage generator configured to generate a program voltage and a select line voltage to apply to the memory block during the program operation, and a read and write circuit configured to temporarily store program data during the program operation and control a potential of bit lines of the memory block based on the temporarily stored program data. The voltage generator is configured to generate the select line voltage as a first select line voltage during a first program operation on some program states among the plurality of program states, and generate the select line voltage as a second select line voltage for which a potential is lower than a potential of the first select line voltage during a second program operation on remaining program states among the plurality of program states.

A semiconductor memory device according to an embodiment of the present disclosure includes a memory block including a plurality of memory cells programmable to first to n-th program states, a voltage generator configured to generate a program voltage and a select line voltage to apply to the memory block during a plurality of program operations corresponding to the respective first to n-th program states, a read and write circuit configured to temporarily store program data during the plurality of program operations and control a potential of bit lines of the memory block based on the temporarily stored program data, and control logic configured to control the voltage generator and the read and write circuit to sequentially perform the plurality of program operations. The control logic is configured to control the voltage generator to generate the select line voltage as a first select line voltage during a program operation corresponding to the first program state to a specific program state, and to generate the select line voltage as a second select line voltage for which a potential is lower than a potential of the first select line voltage during a program operation corresponding to at least one program state next to the specific program state.

A method of operating a semiconductor memory device according to an embodiment of the present disclosure includes setting a drain select line voltage to a first drain select line voltage, sequentially performing a plurality of first program loops corresponding to first to specific program states among first to n-th program states, setting the drain select line voltage to a second drain select line voltage for which a potential is lower than a potential of the first drain select line voltage when a program operation corresponding to the specific program state is completed, and sequentially performing a plurality of second program loops corresponding to a program state next to the specific program state.

According to the present technology, a program disturb phenomenon may be improved by using a downwardly set drain select line voltage during a program operation for a next program state when a program operation for a specific program state is completed during a program operation of a semiconductor memory device.

DETAILED DESCRIPTION

Specific structural or functional descriptions are disclosed in the present specification or application to describe embodiments according to the concept of the present disclosure. These embodiments may be carried out in various forms. Therefore the presented descriptions are not intended to limit possible embodiments but rather to make the present disclosure enabling.

Hereinafter, embodiments of the present disclosure will be described with reference to the accompanying drawings in order to describe in detail enough to allow those of ordinary skill in the art to implement the technical idea of the present disclosure.

Figure 1:
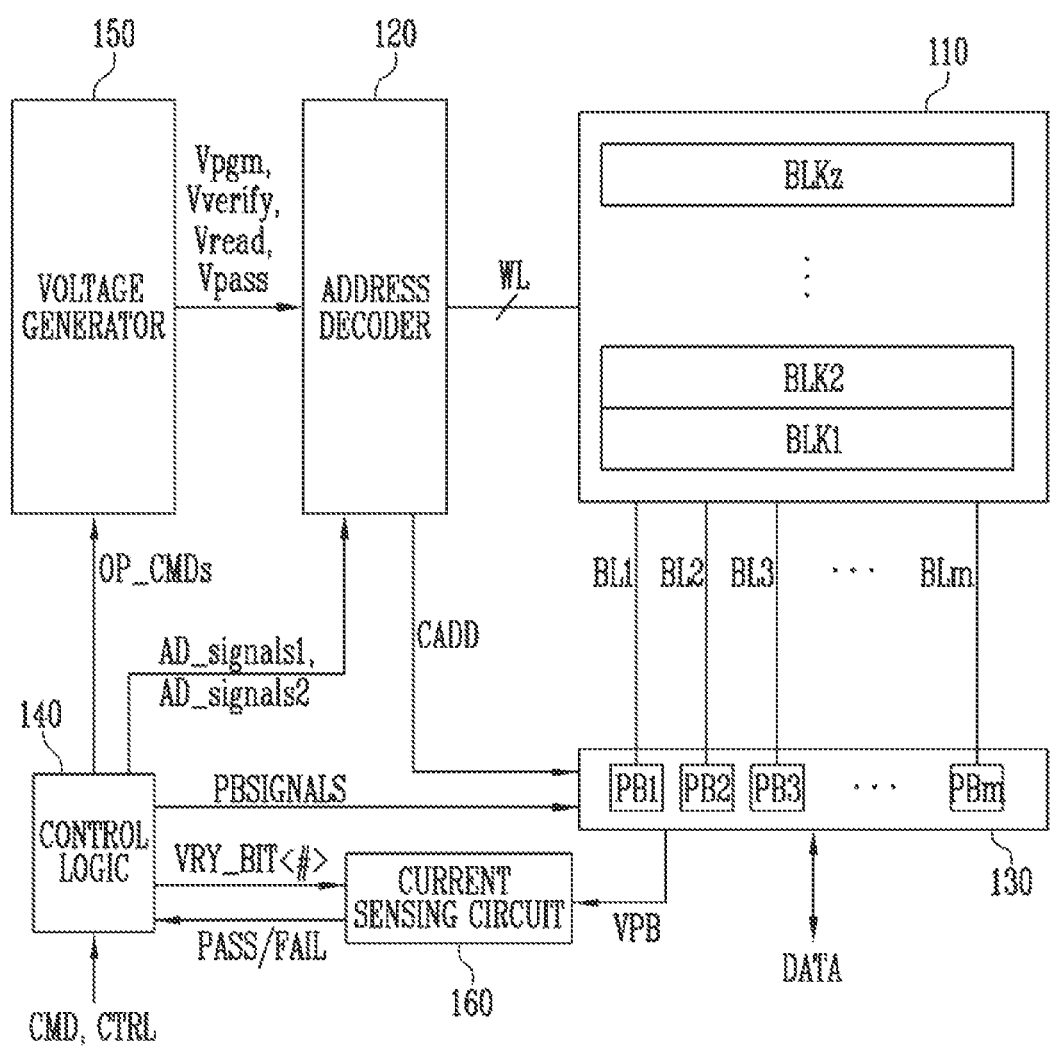
FIG. 1 is a block diagram illustrating a semiconductor memory device according to an embodiment of the present disclosure.

FIG. 1 is a block diagram illustrating a semiconductor memory device according to an embodiment of the present disclosure.

Referring to FIG. 1, a semiconductor memory device 100 includes a memory cell array 110, an address decoder 120, a read and write circuit 130, control logic 140, a voltage generator 150, and a current sensing circuit 160.

The memory cell array 110 includes a plurality of memory blocks BLK1 to BLKz. The plurality of memory blocks BLK1 to BLKz are connected to the address decoder 120 through word lines WL. The plurality of memory blocks BLK1 to BLKz are connected to the read and write circuit 130 through bit lines BL1 to BLm. Each of the plurality of memory blocks BLK1 to BLKz includes a plurality of memory cells. In an embodiment, the plurality of memory cells are non-volatile memory cells, and may be configured of non-volatile memory cells having a vertical channel structure. The memory cell array 110 may be configured as a memory cell array of a two-dimensional structure. According to another embodiment, the memory cell array 110 may be configured as a memory cell array of a three-dimensional structure. Meanwhile, each of the plurality of memory cells included in the memory cell array may store at least one bit of data. In an embodiment, each of the plurality of memory cells included in the memory cell array 110 may be a single-level cell (SLC) storing one bit of data. In another embodiment, each of the plurality of memory cells included in the memory cell array 110 may be a multi-level cell (MLC) storing two bits of data. In still another embodiment, each of the plurality of memory cells included in the memory cell array 110 may be a triple-level cell (TLC) storing three bits of data. In still another embodiment, each of the plurality of memory cells included in the memory cell array 110 may be a quad-level cell (QLC) storing four bits of data. According to an embodiment, the memory cell array 110 may include a plurality of memory cells each storing five or more bits of data.

The address decoder 120 is connected to the memory cell array 110 through word lines WL. The address decoder 120 is configured to operate in response to address decoder control signals AD_signals1 and AD_signals2 output from the control logic 140. The address decoder 120 receives an address through an input/output buffer (not shown) inside the semiconductor memory device 100.

The address decoder 120 is configured to decode a block address among received addresses. The address decoder 120 selects at least one memory block according to the decoded block address. In addition, during a program voltage apply operation in a program operation, the address decoder 120 applies a program voltage Vpgm generated in the voltage generator 150 to a selected word line of the selected memory block and applies a pass voltage Vpass to the remaining unselected word lines. In addition, during a program verify operation, the address decoder 120 applies a verify voltage Vverify generated in the voltage generator 150 to the selected word line of the selected memory block, and applies the pass voltage Vpass to the remaining unselected word lines. In addition, during a read voltage apply operation in the read operation, a read voltage Vread generated in the voltage generator 150 is applied to the selected word line of the selected memory block, and the pass voltage Vpass is applied to the remaining unselected word lines. In addition, during the program operation of the selected memory block, the address decoder 120 may apply a drain select line voltage to a selected drain select line of the selected memory block and apply a source select line voltage to a source select line of the selected memory block.

The address decoder 120 is configured to decode a column address CADD of the received addresses. The address decoder 120 transmits the decoded column address CADD to the read and write circuit 130.

The program operation and the read operation of the semiconductor memory device 100 are performed in a page unit. Addresses received at a time of a request of the read operation and the program operation include a block address, a row address, and a column address. The address decoder 120 selects one memory block and one word line according to the block address and the row address. The column address is decoded by the address decoder 120 and is provided to the read and write circuit 130. In the present specification, memory cells connected to one word line may be referred to as one "physical page".

The read and write circuit 130 includes a plurality of page buffers PB1 to PBm. The read and write circuit 130 may operate as a "read circuit" during the read operation of the memory cell array 110 and may operate as a "write circuit" during a write operation of the memory cell array 110.

During the program operation, the plurality of page buffers PB1 to PBm temporarily store data DATA to be programmed, which is received from the outside of the semiconductor memory device 100, and controls a potential level of corresponding bit lines BL1 to BLm according to the temporarily stored data DATA. For example, when the temporarily stored data DATA corresponds to first data ("0"), each of the plurality of page buffers PB1 to PBm may apply a program permission voltage (for example, a ground voltage Vss) to the corresponding bit line, and when the temporarily stored data DATA corresponds to second data ("1"), each of the plurality of page buffers PB1 to PBm may apply a program inhibition voltage (for example, power voltage Vcc) to the corresponding bit line.

In order to sense a threshold voltage of the memory cells during the program verify operation, the plurality of page buffers PB1 to PBm sense a change of a flowing current amount according to a program state of a corresponding memory cell and latches the change as sensing data while continuously supplying a sensing current to the bit lines connected to the memory cells. When it is determined that the threshold voltage of the corresponding memory cell is equal to or greater than a pre-verify voltage during a pre-verify operation in the program verify operation, the plurality of page buffers PB1 to PBm apply a set bit line voltage to the corresponding bit line. The set bit line voltage may be higher than the program permission voltage and lower than the program inhibition voltage. In addition, when it is determined that the threshold voltage of the corresponding memory cell is equal to or greater than a main verify voltage during a main verify operation in the program verify operation, the plurality of page buffers PB1 to PBm apply the program inhibition voltage to the corresponding bit line.

The plurality of page buffers PB1 to PBm may generate a sensing voltage VPB by using temporarily stored data DATA, which is to be programmed, and the latched sensing data.

The read and write circuit 130 operates in response to page buffer control signals PBSIGNALS output from the control logic 140.

The control logic 140 is connected to the address decoder 120, the read and write circuit 130, the voltage generator 150, and the current sensing circuit 160. The control logic 140 receives a command CMD and a control signal CTRL through the input/output buffer (not shown) of the semiconductor memory device 100. For example, the control logic 140 may generate and output the address decoder control signals AD_signals1 and AD_signals2, the page buffer control signals PBSIGNALS, and control signals OP_CMDs in response to the command CMD and the control signal CTRL.

Meanwhile, the control logic 140 may determine whether a program operation for a plurality of program states has passed or failed in response to a pass signal PASS or a fail signal FAIL received from the current sensing circuit 160. The control logic 140 may be implemented as hardware, software, or a combination of hardware and software. For example, the control logic 140 may be a control logic circuit operating in accordance with an algorithm and/or a processor executing control logic code.

When it is determined that a program operation for a specific program state has passed during the program operation, the control logic 140 according to an embodiment of the present disclosure may downwardly set a drain select line voltage used during a program operation for at least one or more program states next to the specific program state. That is, the control logic 140 may control the voltage generator 150 to use a first drain select line voltage in a first program operation, which is a program operation for a first program state or a specific program state, among program operations for a first program state to an n-th program state and to use a second drain select line voltage for which a potential is lower than that of the first drain select line voltage in a second program operation, which is a program operation for a program state next to the specific program state to the n-th program state.

The voltage generator 150 generates the program voltage Vpgm and the pass voltage Vpass during the program voltage apply operation in the program operation in response to the control signals OP_CMDs output from the control logic 140, and generates verify voltage Vverify and the pass voltage Vpass during the verify operation in the program operation. In addition, the voltage generator 150 generates the read voltage Vread and the pass voltage Vpass during the read operation.

In an embodiment of the present disclosure, after the program operation for a specific program state is completed, the voltage generator 150 may decrease and generate the drain select line voltage during the program operation for at least one or more program states next to the specific program state. For example, the voltage generator 150 may generate and output the first drain select line voltage in the program operation for the first program state to the specific program state among the program operations for the first program state to the n-th program state, and generate and output the second drain select line voltage for which the potential is lower than that of the first drain select line voltage in the program operation for the program state next to the specific program state to the n-th program state. For example, the specific program state may be a program state for which a threshold voltage distribution is the closet to the highest threshold voltage distribution of the program state.

The current sensing circuit 160 may generate a reference current in response to a permission bit VRY_BTI<#> received from the control logic 140 during a current sensing operation, compare a reference voltage generated by the reference current with a sensing voltage VPB received from the page buffers PB1 to PBm included in the read and write circuit 130, and output the pass signal PASS or the fail signal FAIL.

More specifically, during the current sensing operation, the current sensing circuit 160 may compare a voltage generated according to a value of a bit line sense latch included in each of the page buffers PB1 to PBm with the reference voltage generated by the reference current, and determine whether the program operation for the specific program state is completed or incomplete. For example, when it is determined that the program operation for the specific program state is completed, the current sensing circuit 160 may generate and output the pass signal PASS, when it is determined that the program operation for the specific program state is incomplete, the current sensing circuit 160 may generate and output the fail signal FAIL.

The address decoder 120, the read and write circuit 130, and the voltage generator 150 may function as a "peripheral circuit" that performs the program operation, the program verify operation, and the like on the memory cell array 110. The peripheral circuit performs the program operation and the program verify operation on the memory cell array 110 based on the control of the control logic 140.

Figure 2:
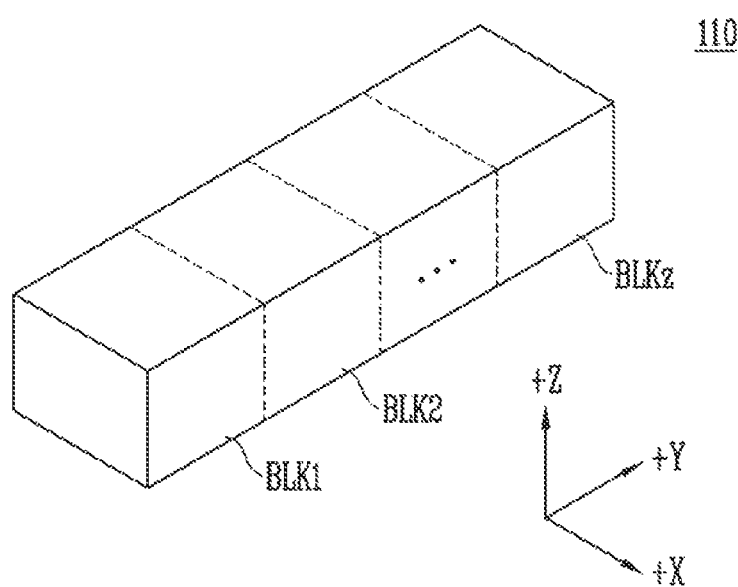
FIG. 2 is a diagram illustrating an embodiment of a memory cell array of FIG. 1.

FIG. 2 is a block diagram illustrating an embodiment of the memory cell array of FIG. 1.

Referring to FIG. 2, the memory cell array 110 includes a plurality of memory blocks BLK1 to BLKz. Each memory block may have a three-dimensional structure. Each memory block includes a plurality of memory cells stacked on a substrate. The plurality of memory cells may be arranged along a +X direction, a +Y direction, and a +Z direction. A structure of each memory block is described in more detail with reference to FIGS. 3 and 4.

Figure 3:
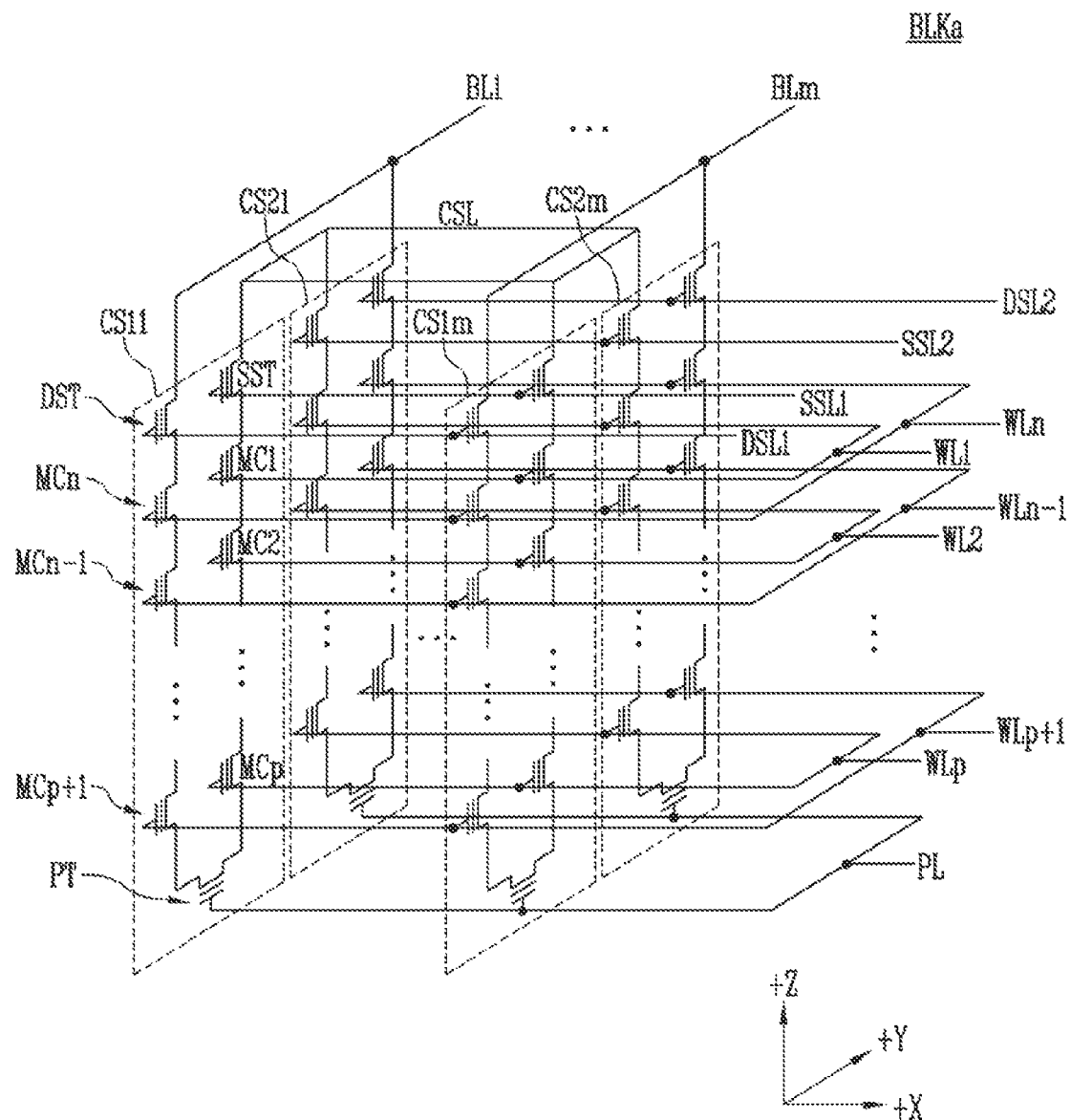
FIG. 3 is a circuit diagram illustrating any one memory block among memory blocks of FIG. 2.

FIG. 3 is a circuit diagram illustrating any one memory block BLKa among the memory blocks BLK1 to BLKz of FIG. 2.

Referring to FIG. 3, the memory block BLKa includes a plurality of cell strings CS11 to CS1m and CS21 to CS2m. In an embodiment, each of the plurality of cell strings CS11 to CS1m and CS21 to CS2m may be formed in a 'U' shape. In the memory block BLKa, m cell strings are arranged in a row direction (that is, the +X direction). In FIG. 3, two cell strings are arranged in a column direction (that is, the +Y direction). However, this is for convenience of description and it may be understood that three or more cell strings may be arranged in the column direction.

Each of the plurality of cell strings CS11 to CS1m and CS21 to CS2m includes at least one source select transistor SST, first to n-th memory cells MC1 to MCn, a pipe transistor PT, and at least one drain select transistor DST.

Each of the select transistors SST and DST and the memory cells MC1 to MCn may have a similar structure. In an embodiment, each of the select transistors SST and DST and the memory cells MC1 to MCn may include a channel layer, a tunneling insulating film, a charge storage film, and a blocking insulating film. In an embodiment, a pillar for providing the channel layer may be provided in each cell string. In an embodiment, a pillar for providing at least one of the channel layer, the tunneling insulating film, the charge storage film, and the blocking insulating film may be provided in each cell string.

The source select transistor SST of each cell string is connected between a common source line CSL and the memory cells MC1 to MCp.

In an embodiment, the source select transistors of the cell strings arranged in the same row are connected to a source select line extending in the row direction, and the source select transistors of the cell strings arranged in different rows are connected to different source select lines. In FIG. 3, the source select transistors of the cell strings CS11 to CS1m of a first row are connected to a first source select line SSL1. The source select transistors of the cell strings CS21 to CS2m of a second row are connected to a second source select line SSL2.

In another embodiment, the source select transistors of the cell strings CS11 to CS1m and CS21 to CS2m may be commonly connected to one source select line.

The first to n-th memory cells MC1 to MCn of each cell string are connected between the source select transistor SST and the drain select transistor DST.

The first to n-th memory cells MC1 to MCn may be divided into first to p-th memory cells MC1 to MCp and (p+1)-th to n-th memory cells MCp+1 to MCn. The first to p-th memory cells MC1 to MCp are sequentially arranged in a direction opposite to the +Z direction, and are connected in series between the source select transistor SST and the pipe transistor PT. The (p+1)-th to n-th memory cells MCp+1 to MCn are sequentially arranged in the +Z direction, and are connected in series between the pipe transistor PT and the drain select transistor DST. The first to p-th memory cells MC1 to MCp and the (p+1)-th to n-th memory cells MCp+1 to MCn are connected to each other through the pipe transistor PT. Gates of the first to n-th memory cells MC1 to MCn of each cell string are connected to the first to n-th word lines WL1 to WLn, respectively.

A gate of the pipe transistor PT of each cell string is connected to a pipeline PL.

The drain select transistor DST of each cell string is connected between a corresponding bit line and the memory cells MCp+1 to MCn. The cell strings arranged in the row direction are connected to the drain select line extending in the row direction. The drain select transistors of the cell strings CS11 to CS1m of the first row are connected to a first drain select line DSL1. The drain select transistors of the cell strings CS21 to CS2m of the second row are connected to a second drain select line DSL2.

Figure 5:
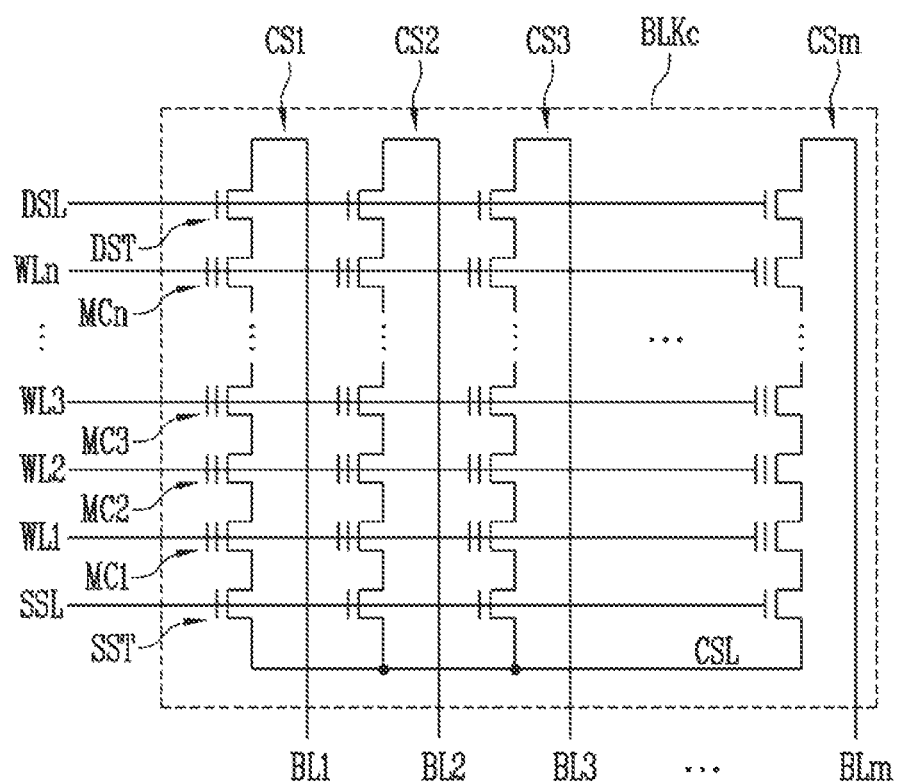
FIG. 5 is a circuit diagram illustrating an embodiment of any one memory block among the memory blocks included in the memory cell array of FIG. 1.

The cell strings arranged in the column direction are connected to the bit lines extending in the column direction. In FIG. 5, the cell strings CS11 and CS21 of the first column are connected to the first bit line BL1. The cell strings CS1m and CS2m of the m-th column are connected to the m-th bit line BLm.

The memory cells connected to the same word line in the cell strings arranged in the row direction configure one page. For example, the memory cells connected to the first word line WL1, among the cell strings CS11 to CS1m of the first row, configure one page. The memory cells connected to the first word line WL1, among the cell strings CS21 to CS2m of the second row, configure another page. The cell strings arranged in one row direction may be selected by selecting any one of the drain select lines DSL1 and DSL2. One page of the selected cell strings may be selected by selecting any one of the word lines WL1 to WLn.

In another embodiment, even bit lines and odd bit lines may be provided instead of the first to m-th bit lines BL1 to BLm. In addition, even-numbered cell strings among the cell strings CS11 to CS1m or CS21 to SC2m arranged in the row direction may be connected to the even bit lines, respectively, and odd-numbered cell strings among the cell strings CS11 to CS1m or CS21 to CS2m arranged in the row direction may be connected to odd bit lines, respectively.

In an embodiment, at least one of the first to n-th memory cells MC1 to MCn may be used as a dummy memory cell. For example, at least one dummy memory cell is provided to reduce an electric field between the source select transistor SST and the memory cells MC1 to MCp. Alternatively, at least one dummy memory cell is provided to reduce an electric field between the drain select transistor DST and the memory cells MCp+1 to MCn. As more dummy memory cells are provided, reliability of an operation for the memory block BLKa is improved, however, the size of the memory block BLKa increases. As less memory cells are provided, the size of the memory block BLKa may be reduced, however, the reliability of the operation for the memory block BLKa may be reduced.

In order to efficiently control at least one dummy memory cell, each of the dummy memory cells may have a required threshold voltage. Before or after an erase operation for the memory block BLKa, program operations for all or a part of the dummy memory cells may be performed. When the erase operation is performed after the program operation is performed, the dummy memory cells may have the required threshold voltage by controlling a voltage applied to dummy word lines connected to the respective dummy memory cells.

Figure 4:
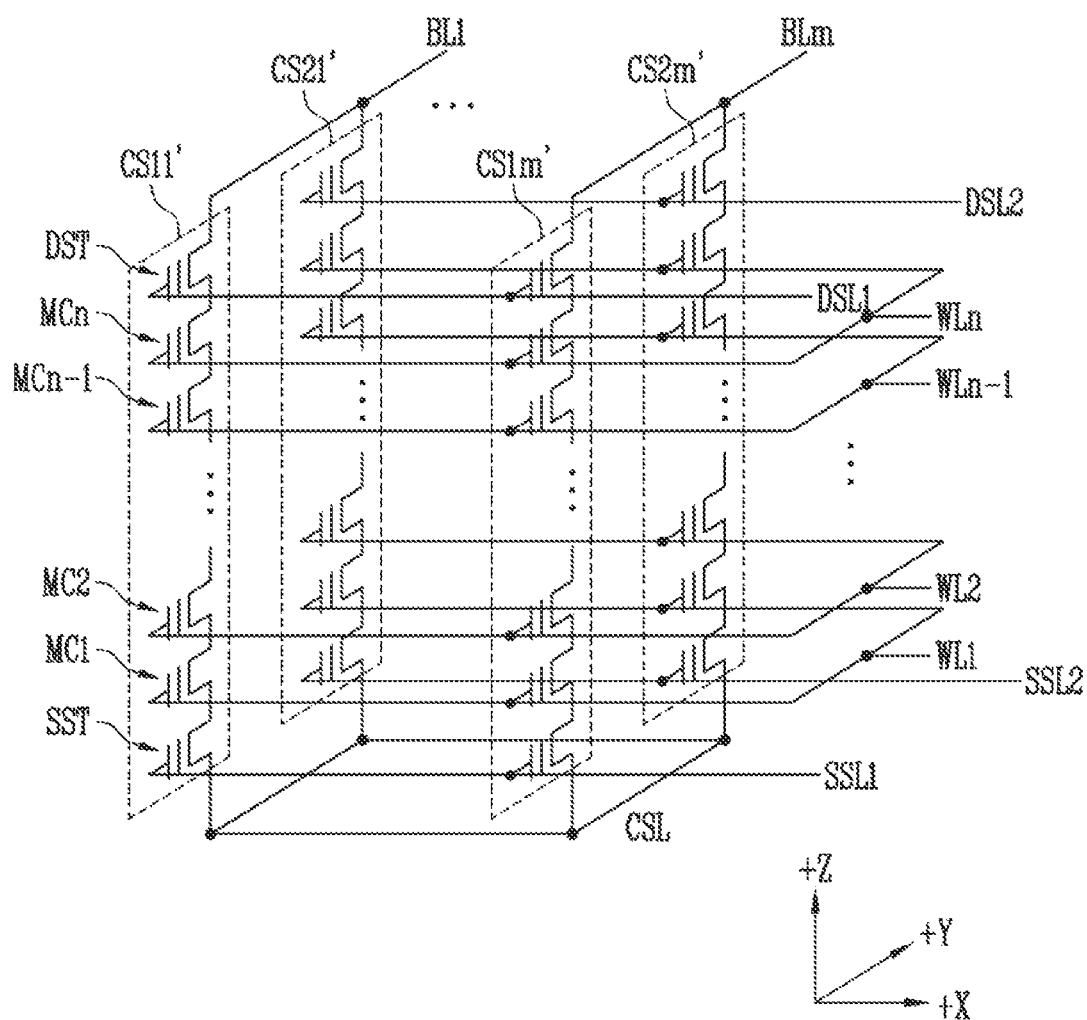
FIG. 4 is a circuit diagram illustrating another embodiment of any one memory block among the memory blocks of FIG. 2.

FIG. 4 is a circuit diagram illustrating another embodiment of any one memory block BLKb among the memory blocks BLK1 to BLKz of FIG. 2.

Referring to FIG. 4, the memory block BLKb includes a plurality of cell strings CS11' to CS1m' and CS21' to CS2m'. Each of the plurality of cell strings CS11' to CS1m' and CS21' to CS2m' extends along a +Z direction. Each of the plurality of cell strings CS11' to CS1m' and CS21' to CS2m' includes at least one source select transistor SST, first to n-th memory cells MC1 to MCn, and at least one drain select transistor DST stacked on a substrate (not shown) under the memory block BLKb.

The source select transistor SST of each cell string is connected between a common source line CSL and memory cells MC1 to MCn. The source select transistors of the cell strings arranged in the same row are connected to the same source select line. The source select transistors of the cell strings CS11' to CS1m' arranged in a first row are connected to a first source select line SSL1. The source select transistors of the cell strings CS21' to CS2m' arranged in a second row are connected to a second source select line SSL2. In another embodiment, the source select transistors of the cell strings CS11' to CS1m' and CS21' to CS2m' may be commonly connected to one source select line.

The first to n-th memory cells MC1 to MCn of each cell string are connected in series between the source select transistor SST and the drain select transistor DST. Gates of the first to n-th memory cells MC1 to MCn are connected to first to the n-th word lines WL1 to WLn, respectively.

The drain select transistor DST of each cell string is connected between a corresponding bit line and the memory cells MC1 to MCn. The drain select transistors of the cell strings arranged in the row direction are connected to a drain select line extending in the row direction. The drain select transistors of the cell strings CS11' to CS1m' of a first row are connected to a first drain select line DSL1. The drain select transistors of the cell strings CS21' to CS2m' of a second row are connected to a second drain select line DSL2.

As a result, the memory block BLKb of FIG. 4 represents a circuit similar to the circuit of the memory block BLKa of FIG. 3 except that the pipe transistor PT is excluded from each cell string.

In another embodiment, even bit lines and odd bit lines may be provided instead of the first to m-th bit lines BL1 to BLm. In addition, even-numbered cell strings among the cell strings CS11' to CS1m' or CS21' to CS2m' arranged in the row direction may be connected to the even bit lines, respectively, and odd-numbered cell strings among the cell strings CS11' to CS1m' or CS21' to CS2m' arranged in the row direction may be connected to odd bit lines, respectively.

In an embodiment, at least one of the first to n-th memory cells MC1 to MCn may be used as a dummy memory cell. For example, at least one dummy memory cell is provided to reduce an electric field between the source select transistor SST and the memory cells MC1 to MCn. Alternatively, at least one dummy memory cell is provided to reduce an electric field between the drain select transistor DST and the memory cells MC1 to MCn. As more dummy memory cells are provided, reliability of an operation for the memory block BLKb is improved, however, the size of the memory block BLKb increases. As less memory cells are provided, the size of the memory block BLKb may be reduced, however, the reliability of the operation for the memory block BLKb may be reduced.

In order to efficiently control at least one dummy memory cell, each of the dummy memory cells may have a required threshold voltage. Before or after an erase operation for the memory block BLKb, program operations for all or a part of the dummy memory cells may be performed. When the erase operation is performed after the program operation is performed, the dummy memory cells may have the required threshold voltage by controlling a voltage applied to the dummy word lines connected to the respective dummy memory cells.

FIG. 5 is a circuit diagram illustrating an embodiment of any one memory block BLKc among the memory blocks BLK1 to BLKz included in the memory cell array 110 of FIG. 1.

Referring to FIG. 5, the memory block BLKc includes a plurality of cell strings CS1 to CSm. The plurality of cell strings CS1 to CSm may be connected to a plurality of bit lines BL1 to BLm, respectively. Each of the cell strings CS1 to CSm includes at least one source select transistor SST, first to n-th memory cells MC1 to MCn, and at least one drain select transistor DST.

Each of the select transistors SST and DST and the memory cells MC1 to MCn may have a similar structure. In an embodiment, each of the select transistors SST and DST and the memory cells MC1 to MCn may include a channel layer, a tunneling insulating film, a charge storage film, and a blocking insulating film. In an embodiment, a pillar for providing the channel layer may be provided in each cell string. In an embodiment, a pillar for providing at least one of the channel layer, the tunneling insulating film, the charge storage film, and the blocking insulating film may be provided in each cell string.

The source select transistor SST of each cell string is connected between a common source line CSL and the memory cells MC1 to MCn.

The first to n-th memory cells MC1 to MCn of each cell string are connected between the source select transistor SST and the drain select transistor DST.

The drain select transistor DST of each cell string is connected between a corresponding bit line and the memory cells MC1 to MCn.

Memory cells connected to the same word line configure one page. The cell strings CS1 to CSm may be selected by selecting the drain select line DSL. One page among the selected cell strings may be selected by selecting any one of the word lines WL1 to WLn.

In another embodiment, even bit lines and odd bit lines may be provided instead of the first to m-th bit lines BL1 to BLm. Even-numbered cell strings among the cell strings CS1 to CSm may be connected to the even bit lines, respectively, and odd-numbered cell strings may be connected to odd bit lines, respectively.

As described above, memory cells connected to one word line may configure one physical page. In the example of FIG. 5, among the memory cells belonging to the memory block BLKc, m memory cells connected to any one of the plurality of word lines WL1 to WLn configure one physical page.

As shown in FIGS. 2 to 4, the memory cell array 110 of the semiconductor memory device 100 may be configured in a three-dimensional structure, but as shown in FIG. 5, the memory cell array 110 may be configured in a two-dimensional structure.

Figure 6:
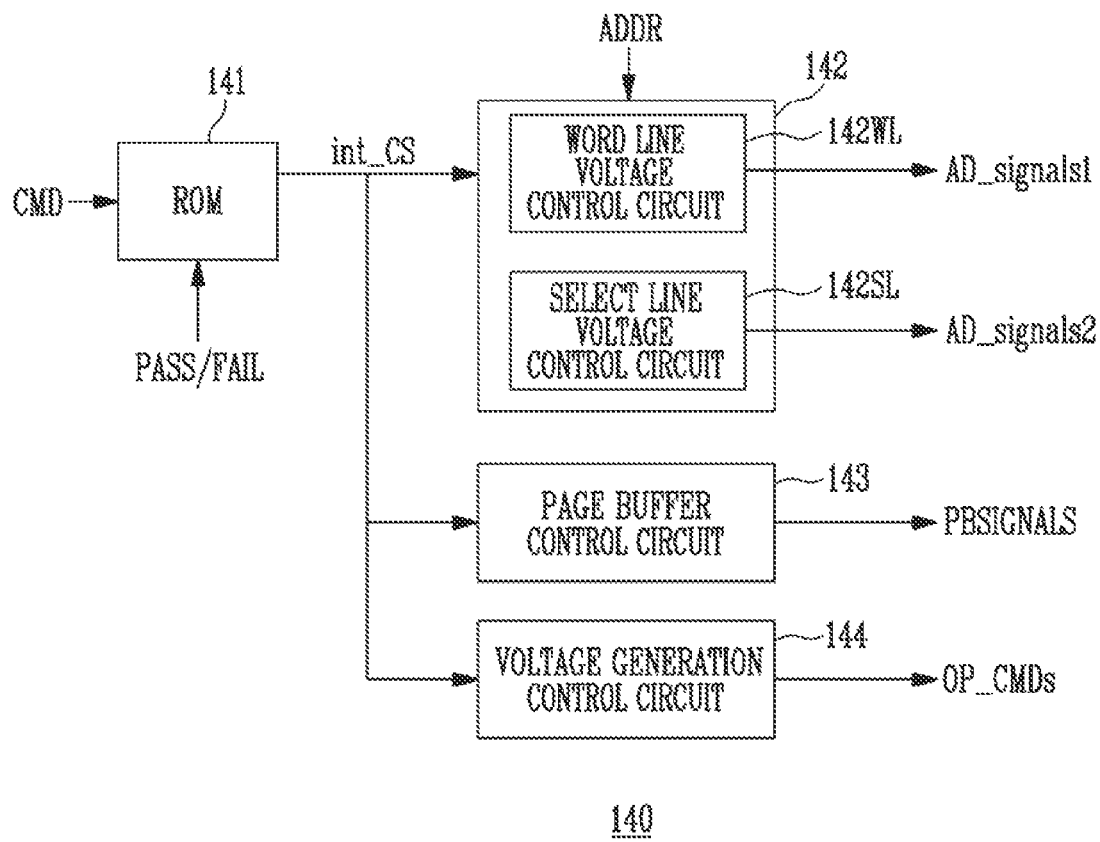
FIG. 6 is a diagram illustrating an embodiment of control logic shown in FIG. 1.

FIG. 6 is a diagram illustrating an embodiment of the control logic 140 of FIG. 1.

Referring to FIG. 6, the control logic 140 may include ROM 141, an address decoder control circuit 142, a page buffer control circuit 143, and a voltage generation control circuit 144.

The ROM 141 may store an algorithm for performing various operations (the program operation, the read operation, the erase operation, and the like) of the semiconductor memory device. The ROM 141 outputs an internal control signal int_CS in response to the command CMD and the pass/fail signal PASS/FAIL received from the current sensing circuit 160 of FIG. 1. For example, the pass/fail signal PASS/FAIL may be a signal indicating completion or incompletion of the program operation for the specific program state.

The address decoder control circuit 142 generates and outputs the address decoder control signals AD_signals1 and AD_signals2 for controlling the address decoder 120 of FIG. 1 in response to the internal control signal int_CS output from the ROM 141.

The address decoder control circuit 142 may include a word line voltage control circuit 142WL and a select line voltage control circuit 142SL.

The word line voltage control circuit 142WL generates and outputs the address decoder control signals AD_signals1 in response to the internal control signal int_CS. In an embodiment, the address decoder control signals AD_signals1 are signals for controlling the address decoder 120 of FIG. 1 to selectively apply operation voltages (for example, the program voltage, the pass voltage, and the like) generated in the voltage generator 150 of FIG. 1 to the word lines WL.

The select line voltage control circuit 142SL generates and outputs the address decoder control signals AD_signals2 in response to the internal control signal int_CS. In an embodiment, the address decoder control signals AD_signals2 are signals for controlling the address decoder 120 of FIG. 1 to selectively apply the drain select line voltage and the source select line voltage generated in the voltage generator 150 of FIG. 1 to the drain select line and the source select line.

The page buffer control circuit 143 generates and outputs the page buffer control signals PBSIGNALS for controlling the read and write circuit 130 of FIG. 1 in response to the internal control signal int_CS output from the ROM 141.

The voltage generation control circuit 144 generates and outputs the control signals OP_CMDs for controlling the voltage generator 150 of FIG. 1 in response to the internal control signal int_CS output from the ROM 141. In an embodiment, the voltage generator 150 of FIG. 1 may generate the program voltage applied to the selected word line during the program operation, the pass voltage applied to the remaining unselected word lines, the drain select line voltage applied to the drain select line of the selected memory block, and the source select line voltage applied to the source select line of the selected memory block in response to the control signals OP_CMDs.

Figure 7:
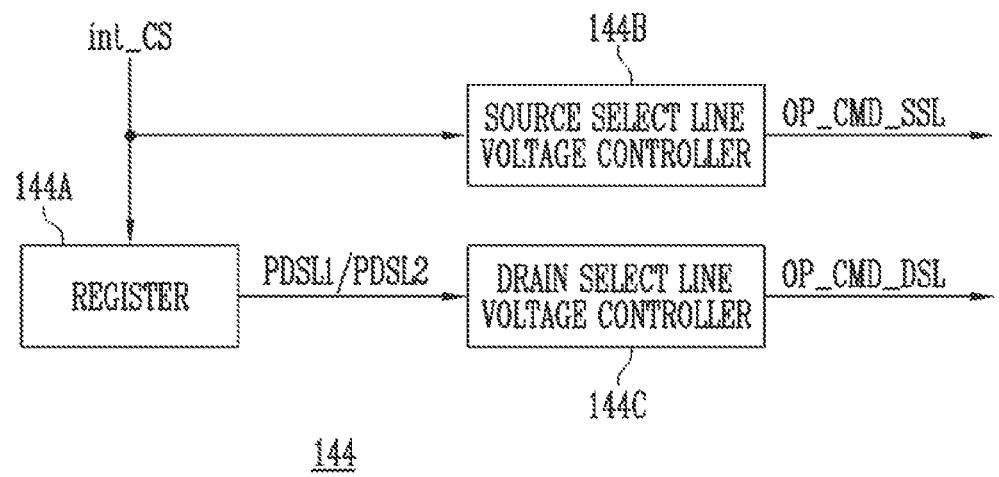
FIG. 7 is a diagram illustrating an embodiment of a voltage generation control circuit of FIG. 6.

FIG. 7 is a diagram illustrating an embodiment of the voltage generation control circuit 144 of FIG. 6.

Referring to FIG. 7, the voltage generation control circuit 144 may include a register 144A, a source select line voltage controller 144B, and a drain select line voltage controller 144C.

The register 144A may store information PDSL1 corresponding to the first drain select line voltage and information PDSL2 corresponding to the second drain select line voltage. The potential of the second drain select line voltage may be lower than the potential of the first drain select line voltage.

The register 144A may output the information PDSL1 corresponding to the first drain select line voltage or the information PDSL2 corresponding to the second drain select line voltage in response to the internal control signal int_CS. For example, the register 144A outputs the information PDSL1 corresponding to the first drain select line voltage in response to the internal control signal int_CS during the program operation for the first to specific program states among the program operations for the first to n-th program states. The register 144A outputs the information PDSL2 corresponding to the second drain select line voltage in response to the internal control signal int_CS during the program operation for the program state next to the specific program state to n-th program states among the program operations for the first to n-th program states. The internal control signal int_CS may include Information on a program state corresponding to a program operation that is being currently performed.

The source select line voltage controller 144B generates and outputs a source select line voltage control signal OP_CMD_SSL in response to the Internal control signal int_CS. The source select line voltage control signal OP_CMD_SSL may be a signal included in the control signals OP_CMDs of FIG. 6, and the source select line voltage control signal OP_CMD_SSL may be a signal for controlling a potential level of the source select line voltage generated in the voltage generator 150 of FIG. 1.

The drain select line voltage controller 144C generates and outputs a drain select line voltage control signal OP_CMD_DSL in response to the information PDSL1 corresponding to the first drain select line voltage or the information PDSL2 corresponding to the second drain select line voltage received from the register 144A. The drain select line voltage control signal OP_CMD_DSL may be a signal included in the control signals OP_CMDs of FIG. 6, and the drain select line voltage control signal OP_CMD_DSL may be a signal for controlling a potential level of the drain select line voltage generated in the voltage generator 150 of FIG. 1. For example, when the information PDSL1 corresponding to the first drain select line voltage is received from the register 144A, the drain select line voltage controller 144C generates the drain select line voltage control signal OP_CMD_DSL for controlling the voltage generator 150 of FIG. 1 to generate the first drain select line voltage. In addition, when the information PDSL2 corresponding to the second drain select line voltage is received from the register 144A, the drain select line voltage controller 144C may generate the drain select line voltage control signal OP_CMD_DSL for controlling the voltage generator 150 of FIG. 1 to generate the second drain select line voltage.

Figure 8:
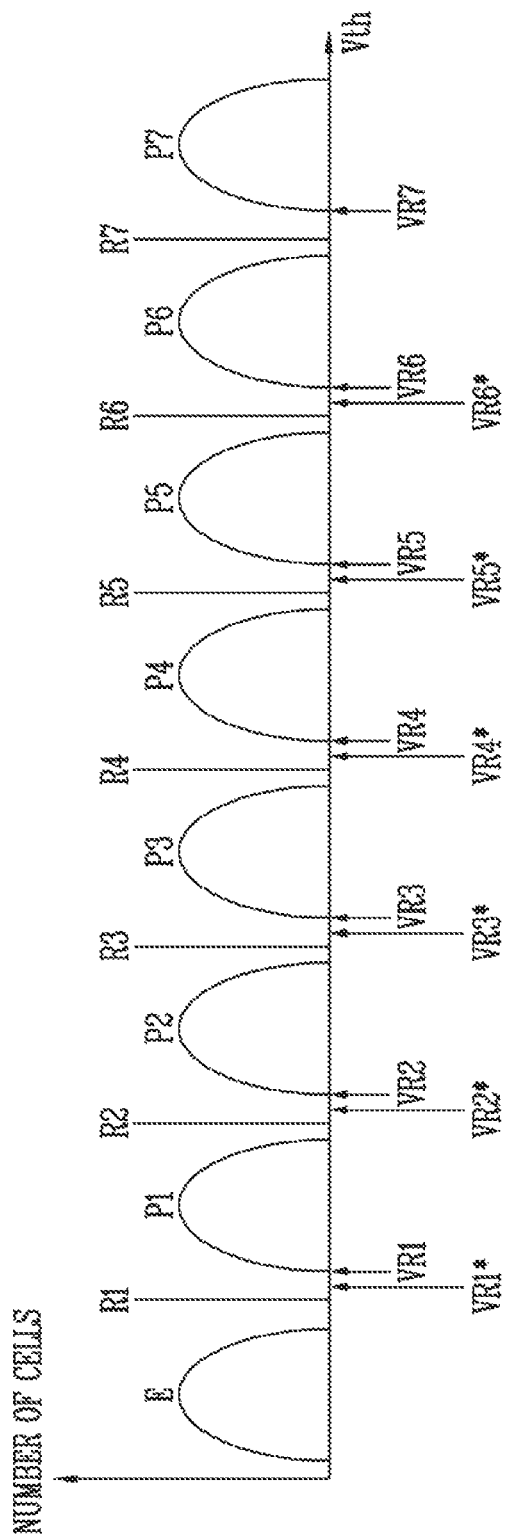
FIG. 8 is a graph illustrating program states of a triple-level cell.

FIG. 8 is a graph illustrating program states of a triple-level cell.

Referring to FIG. 8, a triple-level cell (TLC) has threshold voltage states corresponding to each of one erase state E and seven program states P1 to P7. The erase state E and the first to seventh program states P1 to P7 have a corresponding bit code. Various bit codes may be given to the erase state E and the first to seventh program states P1 to P7 as necessary.

Each threshold voltage state may be distinguished based on the first to seventh read voltages R1 to R7. In addition, main verify voltages VR1 to VR7 may be used during the main verify operation for determining whether a program of the memory cells corresponding to each program state is completed.

Pre-verify voltages VR1* to VR6* may have a voltage lower than the main verify voltages VR1 to VR6. The pre-verify voltages VR1* to VR6* may be used during the pre-verify operation, and it may be determined whether the memory cells are programmed to have a threshold voltage higher than the pre-verify voltages VR1* to VR6* during the pre-verify operation. The pre-verify voltages VR1* to VR6* are lower than a target threshold voltage of the memory cells. For example, the target threshold voltage may be the main verify voltages VR1 to VR6.

Although the target program states of the TLC are shown in FIG. 8, this merely serves as an example, and the plurality of memory cells included in the semiconductor memory device according to an embodiment of the present disclosure may be a multi-level cell (MLC). In still another embodiment, the plurality of memory cells included in the semiconductor memory device according to an embodiment of the present disclosure may be quad-level cells (QLCs).

Figure 9:
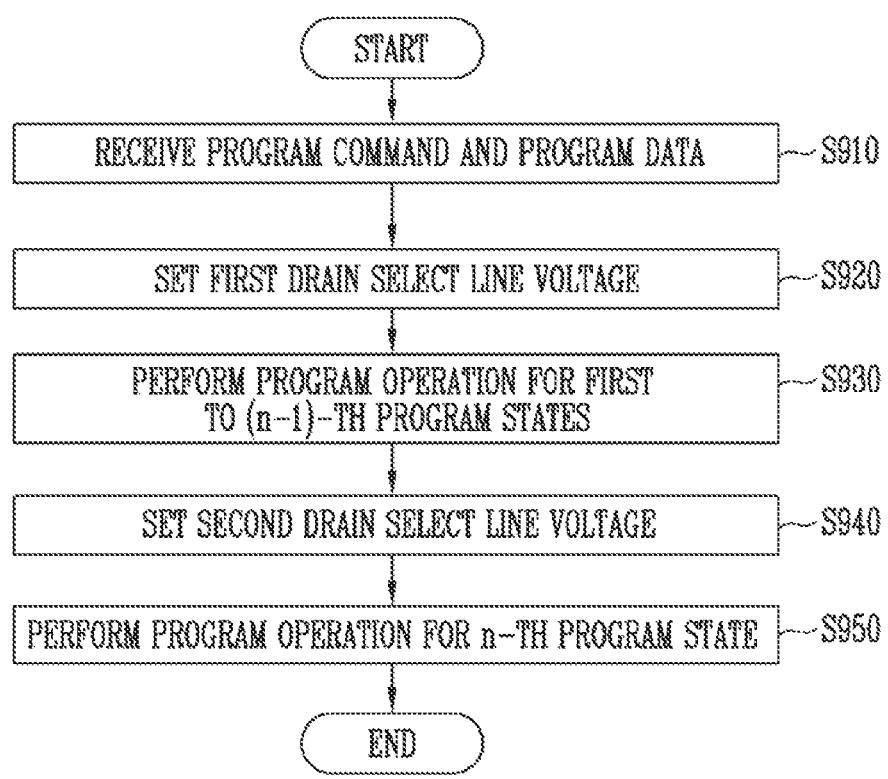
FIG. 9 is a flowchart illustrating a program operation method of a semiconductor memory device according to an embodiment of the present disclosure.

FIG. 9 is a flowchart illustrating a program operation method of a semiconductor memory device according to an embodiment of the present disclosure.

Figure 10:
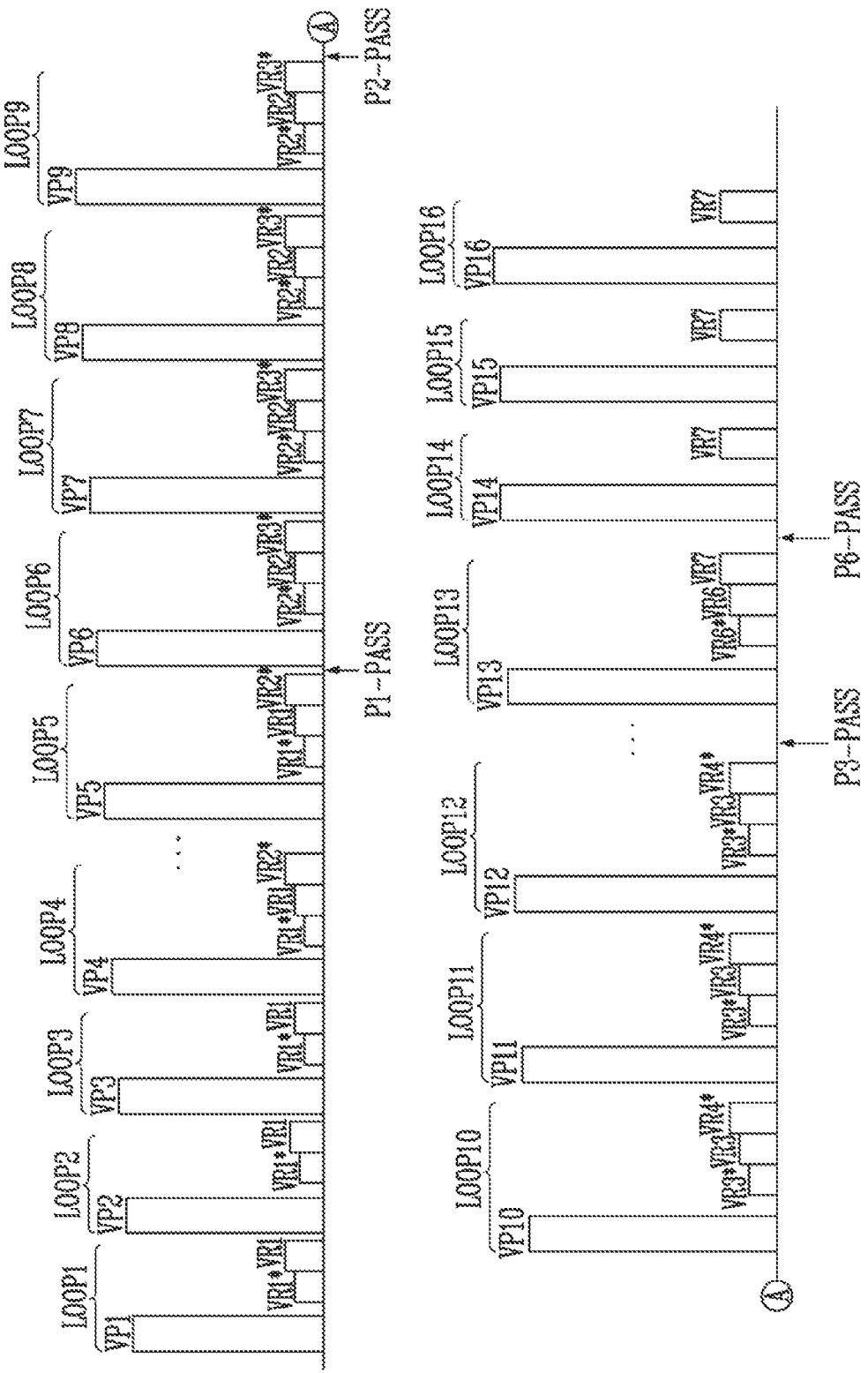
FIG. 10 is a diagram illustrating a plurality of program loops during a program operation of a semiconductor memory device according to an embodiment of the present disclosure.

FIG. 10 is a diagram illustrating a plurality of program loops during a program operation of a semiconductor memory device according to an embodiment of the present disclosure.

Figure 11:
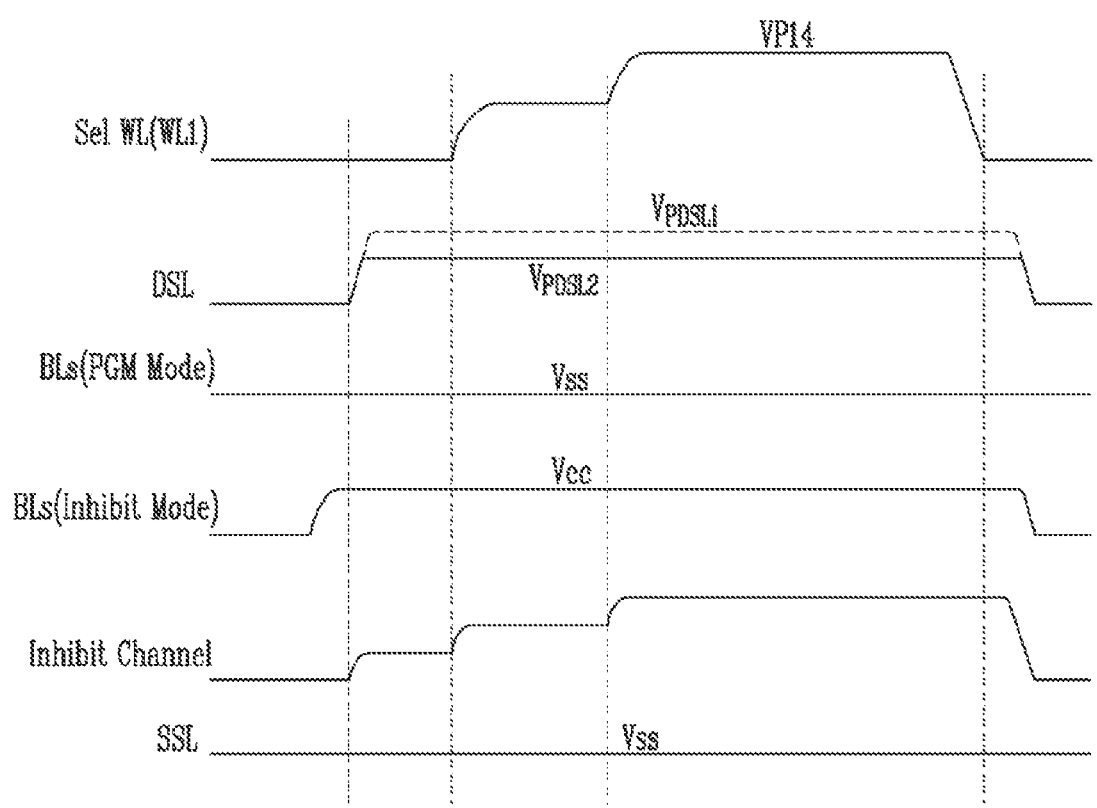
FIG. 11 is a waveform diagram illustrating a voltage applied to a memory block during a program voltage apply operation of a program loop of FIG. 10.

FIG. 11 is a waveform diagram illustrating a voltage applied to a memory block during a program voltage apply operation of a program loop LOOP14 of FIG. 10.

The program operation of the semiconductor memory device according to an embodiment of the present disclosure is described with reference to FIGS. 1 to 11 as follows.

In an embodiment, programming the memory cells in the TLC method is described as an example. In an embodiment, among the erase state E and the first to seventh program states P1 to P7 corresponding to the TLC, each of the program loops corresponding to the first to sixth program states includes the pre-verify operation and the main verify operation, and each of the program loops corresponding to the seventh program state includes the main verify operation without the pre-verify operation. In addition, in an embodiment, an example in which the specific program state is set as the sixth program state P6 among the erase state E and the first to seventh program states P1 to P7 corresponding to the TLC is described as an example. The specific program state may be a program state corresponding to a program loop that is performed last among the program states corresponding to the program loops including the pre-verify operation and the main verify operation during the program operation. For example, the program loops corresponding to the first to sixth program states P1 to P6 among the first to seventh program states P1 to P7 may include the pre-verify operation and the main verify operation, and the program loop corresponding to the seventh program state P7 may perform only the main verify operation without the pre-verify operation. In this case, the sixth program state P6 corresponding to the program loop that is performed last among the first to sixth program states P1 to P6 may be the specific program state.

In step S910, a program command CMD and program data DATA corresponding to the program operation are received from the outside of the semiconductor memory device 100.

The control logic 140 generates and outputs the address decoder control signals AD_signals1 and AD_signals2, the page buffer control signals PBSIGNALS, and the control signals OP_CMDs for controlling the peripheral circuit to perform the program operation of the semiconductor memory device 100 in response to the program command CMD and the control signal CTRL.

The plurality of page buffers PB1 to PBm of the read and write circuit 130 receive and temporarily store the program data DATA.

In step S920, the control logic 140 sets the drain select line voltage applied to the drain select line DSL of the selected memory block (for example, BLKc) as a first drain select line voltage $V_{PDSL1}$ during the program operation. For example, the register 144A of the voltage generation control circuit 144 may output the information PDSL1 corresponding to the first drain select line voltage in response to the internal control signal int_CS.

In step S930, the peripheral circuit performs the program operation for the first to (n−1)-th program states among the first to n-th program states under the control of the control logic 140. For example, the (n−1)-th program state may be the specific program state, and in an embodiment, the (n−1)-th program state may be the sixth program state P6. The program operation for the first to (n−1)-th program states, that is, the program operation for the first to specific program states, may be defined as the first program operation.

The program operation for the first to n-th program states is described in more detail as follows.

Referring to FIG. 10, a plurality of program loops LOOP1 to LOOP13 corresponding to the first to sixth program states P1 to P6 are sequentially performed. For example, the program loops LOOP1 to LOOP5 correspond to the first program state P1, and the program loops LOOP6 to LOOP9 correspond to the second program state P2. In addition, the program loops LOOP10 to LOOP12 correspond to the third program state P3, and the program loop LOOP13 corresponds to the sixth program state P6. In FIG. 10, the program loops corresponding to the fourth and fifth program states P4 and P5 are not shown, but for convenience of description, some program loops are not shown. It is preferable that the program loop corresponding to the fourth and fifth program states P4 and P5 is substantially disposed between the program loop LOOP12 and the program loop LOOP13 and is performed.

Each of the plurality of program loops LOOP1 to LOOP13 corresponding to the first to sixth program states P1 to P6 includes the program voltage apply operation, at least one pre-verify operation, and the main verify operation. For example, the program loop LOOP1 may include the program voltage apply operation in which a program voltage VP1 is applied to the selected word line WL1, the pre-verify operation in which the pre-verify voltage VR1* is applied to the selected word line WL1, and the main verify operation in which the main verify voltage VR1 is applied to the selected word line WL1.

During the program voltage apply operation, the voltage generator 150 may generate the first drain select line voltage $V_{PDSL1}$ in response to the drain select line voltage control signal OP_CMD_DSL output from the drain select line voltage controller 144C, the address decoder 120 may apply the first drain select line voltage $V_{PDSL1}$ to the drain select line DSL of the selected memory block BLKc. The plurality of page buffers PB1 to PBm apply the program permission voltage or the program inhibition voltage to the corresponding bit lines BL1 to BLm based on the temporarily stored program data DATA. During the program voltage apply operation, the voltage generator 150 generates the program voltage VP1, and the address decoder 120 applies the program voltage VP1 generated in the voltage generator 150 to the selected word line WL1.

During the pre-verify operation, the plurality of page buffers PB1 to PBm sense the current amount of the corresponding bit lines BL1 to BLm to latch the sensing data, and apply the set bit line voltage higher than the program permission voltage and lower than the program inhibition voltage to the bit lines connected to the memory cells for which the threshold voltage is higher than the pre-verify voltage VR1' among the memory cells to be programmed to the first to seventh program states based on the temporarily stored program data DATA and the sensing data. The plurality of page buffers PB1 to PBm apply the program permission voltage to the bit lines connected to the memory cells for which the threshold voltage is lower than the pre-verify voltage VR1* among the memory cells to be programmed to the first to seventh program states.

During the main verify operation, the plurality of page buffers PB1 to PBm sense the current amount of the corresponding bit lines BL1 to BLm to latch the sensing data, and apply the program inhibition voltage to the bit lines connected to the memory cells for which the threshold voltage is higher than the verify voltage VR1 among the memory cells to be programmed to the first program state P1 based on the temporarily stored program data DATA and the sensing data.

Thereafter, set number of program loops, for example, the program loops LOOP2 and LOOP3, are performed in the same method as the program loop LOOP1. After the set number of program loops LOOP1 to LOOP3 are performed, from the next program loop (for example, LOOP4), the program voltage apply operation for the first program state P1, the pre-verify operation, the main verify operation, and the pre-verify operation for the next program state may be performed together. For example, after sequentially performing the program voltage apply operation, the pre-verify operation, and the main verify operation for the first program state P1 in the program loop LOOP4, the pre-verify operation for the second program state P2 may be performed.

As described above, the pre-verify operation is performed in each program loop, and the set bit line voltage higher than the program permission voltage is applied to the bit lines connected to the memory cells programmed with the threshold voltage higher than the pre-verify voltage as a result of the pre-verify operation. Therefore, the threshold voltage of the memory cells programmed with the threshold voltage higher than the pre-verify voltage may be increased more precisely in the next program loop, and thus a threshold voltage distribution width of the memory cells may be formed to be narrower.

After each program loop is performed, the current sensing circuit 160 may perform a current sensing operation to determine whether the program operation for each program state is completed, and output the pass signal PASS or the fail signal FAIL. For example, as a result of the current sensing operation performed after the program loop LOOP is completed, when the program is completed so that the memory cells to be programmed to the first program state P1 have the threshold voltage greater than the main verify voltage VR1, the current sensing circuit 160 generates and outputs the pass signal PASS.

In the above-described method, the address decoder 120, the read and write circuit 130, the voltage generator 150, and the current sensing circuit 160 sequentially perform the program operation corresponding to the first to sixth program states P1 to P6 for the memory cells MC1 connected to the selected word line WL1 of the selected memory block BLKc. That is, the program loops LOOP1 to LOOP13 corresponding to the first to sixth program states P1 to P6 are sequentially performed.

During the program voltage apply operation of each of the plurality of program loops LOOP1 to LOOP13 corresponding to the program operation corresponding to the above-described first to sixth program states, the voltage generator 150 generates the first drain select line voltage $V_{PDSL1}$, and the address decoder 120 applies the first drain select line voltage $V_{PDSL1}$ to the drain select line DSL of the selected memory block BLKc.

As a result of the current sensing operation performed after the program loop LOOP13 is completed, when the program is completed so that the memory cells to be programmed to the sixth program state P6 have the threshold voltage greater than the main verify voltage VR6, the current sensing circuit 160 generates and outputs the pass signal PASS.

In step S940, the control logic 140 sets the drain select line voltage applied to the drain select line DSL of the selected memory block (for example, BLKc) as the second drain select line voltage $V_{PDSL2}$ during the program operation. The potential level of the second drain select line voltage $V_{PDSL2}$ is lower than that of the first drain select line voltage $V_{PDSL1}$. For example, the register 144A of the voltage generation control circuit 144 may output the information PDSL2 corresponding to the second drain select line voltage in response to the internal control signal int_CS.

The first and second drain select line voltages $V_{PDSL1}$ and $V_{PDSL2}$ may be greater than a sum of the highest threshold voltage value in the threshold voltage distribution and a set bit line voltage value of the drain select transistors DST, and may be less than a sum of the lowest threshold voltage value in the threshold voltage distribution and a program inhibition voltage value.

In step S950, the peripheral circuit performs the program operation for the n-th program state among the first to n-th program states under the control of the control logic 140. In the embodiment, the n-th program state is the seventh program state P7. The program operation for at least one program state next to the specific program state (for example P6) may be defined as the second program operation.

The program operation for the seventh program state P7 is described in more detail as follows.

Referring to FIG. 10, a plurality of program loops LOOP14 to LOOP16 corresponding to the seventh program state P7 are sequentially performed. Each of the plurality of program loops LOOP14 to LOOP16 corresponding to the seventh program state P7 includes the program voltage apply operation and the main verify operation. Because the seventh program state P7 has the largest threshold voltage distribution among the plurality of program states and is the program state that is programmed last among the plurality of program states, a program operation speed may be improved by performing the main verify operation without the pre-verify operation. For example, each of the plurality of program loops LOOP14 to LOOP16 corresponding to the seventh program state P7 may include the program voltage apply operation in which program voltages VP14, VP15, and VP16 are applied to the selected word line WL1, and the main verify operation in which a main verify voltage VR7 is applied to the selected word line WL1.

The program voltage apply operation of the program loop LOOP14 is described with reference to FIG. 11 as follows.

Because the program voltage apply operations of each of the plurality of program loops LOOP14 to LOOP16 corresponding to the seventh program state P7 are similar to each other, the program voltage apply operation of the program loop LOOP14 is representatively described.

Among the bit lines of the selected memory block, the program permission voltage (for example, Vss) is applied to the bit lines in a program mode PGM Mode, and the program inhibition voltage (for example, Vcc) is applied to the bit lines in a program inhibition mode Inhibit Mode.

Thereafter, the second drain select line voltage $V_{PDSL2}$ for which the potential level is lower than that of the first drain select line voltage $V_{PDSL1}$ is applied to the drain select line DSL of the selected memory block, and thus a potential level of a channel Inhibit Channel of cell strings corresponding to the bit lines in the program inhibition mode Inhibit Mode increases.

Thereafter, a program voltage VP14 is applied to the selected word line Sel WL (WL1) of the selected memory block, and the memory cells connected to the selected word line Sel WL (WL1) and the bit lines in the program mode PGM Mode are programmed. At this time, the potential level of the channel Inhibit Channel of the cell strings corresponding to the bit lines in the program inhibition mode Inhibit Mode is boosted by the program voltage VP14 applied to the selected word line Sel WL (WL1), and thus the potential level may be further increased. In addition, the second drain select line voltage $V_{PDSL2}$ for which the potential level is lower than that of the first drain select line voltage $V_{PDSL1}$ is applied to the drain select line DSL, and thus a leakage current flowing from the inhibition channel Inhibit Channel of the cell strings to the bit line is suppressed. During the program voltage apply operation, a ground voltage Vss may be applied to the source select line SSL.

As described above, during the program voltage apply operation of each of the plurality of program loops LOOP14 to LOOP16 corresponding to the seventh program state P7, the voltage generator 150 may generate the second drain select line voltage $V_{PDSL2}$ in response to the drain select line voltage control signal OP_CMD_DSL output from the drain select line voltage controller 144C, and the address decoder 120 may apply the second drain select line voltage $V_{PDSL2}$ to the drain select line DSL of the selected memory block BLKc. The second drain select line voltage $V_{PDSL2}$ for which the potential level is lower than that of the first drain select line voltage $V_{PDSL1}$ is applied to the drain select line DSL. Therefore, occurrence of a leakage current in which the channel potential of the cell strings corresponding to the bit lines for which the program operation is completed and to which the program inhibition voltage is applied is leaked to the bit line through the drain select transistor DST among the plurality of cells strings CS1 to CSm may be suppressed. Accordingly, the cell string corresponding to the bit lines of the program inhibition mode to which the program inhibition voltage is applied may maintain a high channel potential during the program voltage apply operation, thereby improving a program disturb phenomenon.

As a result of the current sensing operation performed after each of the plurality of program loops LOOP14 to LOOP16 being completed, when the program is completed so that the memory cells to be programmed to the seventh program state P7 have the threshold voltage greater than the main verify voltage VR7, the current sensing circuit 160 generates and outputs the pass signal PASS, and the control logic 140 determines that the program operation of the memory cells MC1 connected to the selected word line WL is completed.

In the above-described embodiment, a case where the specific program state is the sixth program state P6 is described as an example, but an embodiment of the present disclosure is not limited thereto. A program state corresponding to a program operation in which the pre-verify operation is not performed among the plurality of program states may be preferably set as the specific program state. For example, among the first to seventh program states P1 to P7, when the pre-verify operation is performed in the program loop corresponding to the first to fourth program states P1 to P4 and only the main verify operation is included without the pre-verify operation in the program loop corresponding to the fifth to seventh program states P5 to P7, the specific program state may be set to the fourth program state P4. That is, in an embodiment of the present disclosure, the program operations corresponding to the plurality of program states may be sequentially performed according to a threshold voltage distribution arrangement order of the plurality of program states, the first drain select line voltage $V_{PDSL1}$ may be used in the program operation including the pre-verify operation, and the second drain select line voltage $V_{PDSL2}$ for which the potential Is lower than that of the drain select line voltage $V_{PDSL1}$ may be used in the program operation including only the main verify operation without the pre-verify operation. Accordingly, the drain select transistors DST may suppress the occurrence of a leakage current due to the second drain select line voltage, and thus the channel potential of the cell strings of the program inhibition mode may be maintained at a high state, thereby improving the program disturb phenomenon.

Figure 12:
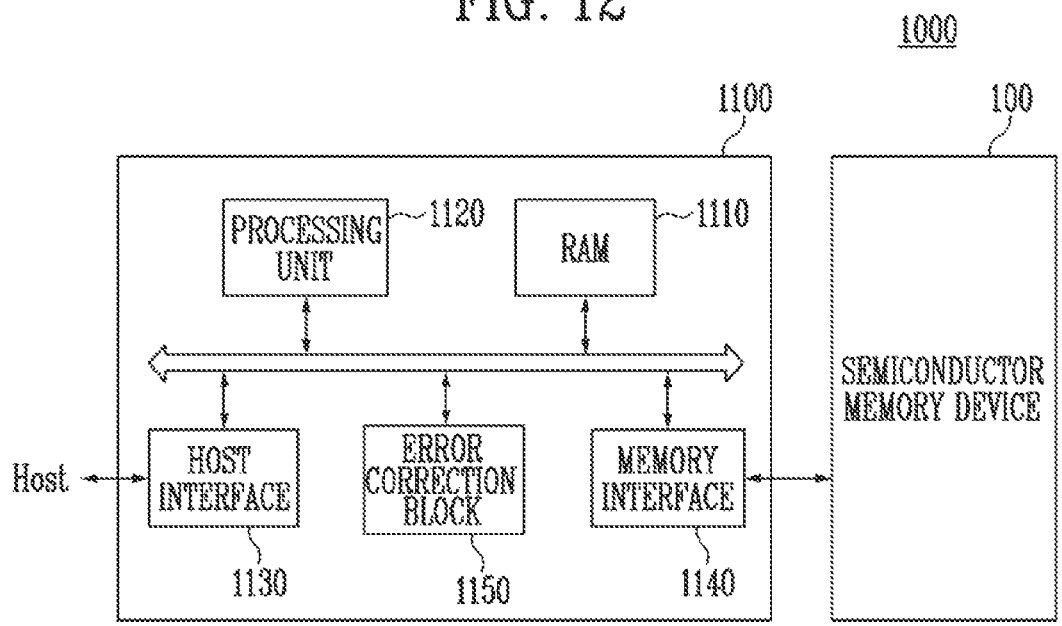
FIG. 12 is a block diagram illustrating an embodiment of a memory system including the semiconductor memory device of FIG. 1.

FIG. 12 is a block diagram illustrating an embodiment 1000 of a memory system including the semiconductor memory device 100 of FIG. 1.

Referring to FIG. 12, the memory system 1000 includes the semiconductor memory device 100 and a controller 1100. The semiconductor memory device 100 may be the semiconductor memory device described with reference to FIG. 1. Hereinafter, repetitive description is omitted.

The controller 1100 is connected to the host Host and the semiconductor memory device 100. The controller 1100 is configured to access the semiconductor memory device 100 in response to the request from the host Host. For example, the controller 1100 is configured to control read, write, erase, and background operations of the semiconductor memory device 100. The controller 1100 is configured to provide an interface between the semiconductor memory device 100 and the host Host. The controller 1100 is configured to drive firmware for controlling the semiconductor memory device 100.

The controller 1100 includes random access memory (RAM) 1110, a processing unit 1120, a host interface 1130, a memory interface 1140, and an error correction block 1150. The RAM 1110 is used as any one of operation memory of the processing unit 1120, cache memory between the semiconductor memory device 100 and the host Host, and buffer memory between the semiconductor memory device 100 and the host Host. The processing unit 1120 controls overall operations of the controller 1100. In addition, the controller 1100 may temporarily store program data provided from the host Host during the program operation.

The host interface 1130 includes a protocol for performing data exchange between the host Host and the controller 1100. In an embodiment, the controller 1100 is configured to communicate with the host Host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial ATA protocol, a parallel ATA protocol, a small computer system interface (SCSI) protocol, an enhanced small disk interface (ESDI) protocol, an integrated drive electronics (IDE) protocol, and a private protocol.

The memory interface 1140 interfaces with the semiconductor memory device 100. For example, the memory interface includes a NAND interface or a NOR interface.

The error correction block 1150 is configured to detect and correct an error in data received from the semiconductor memory device 100 using an error correcting code (ECC). The processing unit 1120 may control the semiconductor memory device 100 to adjust the read voltage and perform a re-reading operation according to an error detection result of the error correction block 1150. In an embodiment, the error correction block may be provided as a component of the controller 1100.

The controller 1100 and the semiconductor memory device 100 may be integrated into one semiconductor device. In an embodiment, the controller 1100 and the semiconductor memory device 100 may be integrated into one semiconductor device to configure a memory card. For example, the controller 1100 and the semiconductor memory device 100 may be integrated into one semiconductor device to form a memory card such as a PC card (personal computer memory card international association (PCMCIA)), a compact flash card (CF), a smart media card (SM or SMC), a memory stick, a multimedia card (MMC, RS-MMC, or MMCmicro), an SD card (SD, miniSD, microSD, or SDHC), and a universal flash storage (UFS).

The controller 1100 and the semiconductor memory device 100 may be integrated into one semiconductor device to form a semiconductor drive (solid state drive (SSD)). The semiconductor drive (SSD) includes a storage device configured to store data in a semiconductor memory. When the memory system 1000 is used as the semiconductor drive (SSD), an operation speed of the host Host connected to the memory system 1000 is dramatically improved.

As another example, the memory system 1000 is provided as one of various components of an electronic device such as a computer, an ultra-mobile PC (UMPC), a workstation, a net-book, a personal digital assistants (PDA), a portable computer, a web tablet, a wireless phone, a mobile phone, a smart phone, an e-book, a portable multimedia player (PMP), a portable game machine, a navigation device, a black box, a digital camera, a 3-dimensional television, a digital audio recorder, a digital audio player, a digital picture recorder, a digital picture player, a digital video recorder, a digital video player, a device capable of transmitting and receiving information in a wireless environment, one of various electronic devices configuring a home network, one of various electronic devices configuring a computer network, one of various electronic devices configuring a telematics network, an RFID device, or one of various components configuring a computing system.

In an embodiment, the semiconductor memory device 100 or the memory system 1000 may be mounted as a package of various types. For example, the semiconductor memory device 100 or the memory system 1000 may be packaged and mounted in a method such as a package on package (PoP), ball grid arrays (BGAs), chip scale packages (CSPs), plastic leaded chip carriers (PLCC), a plastic dual in line package (PDIP), a die in waffle pack, die in wafer form, a chip on board (COB), a ceramic dual in line package (CERDIP), a plastic metric quad flat pack (MQFP), a thin quad flat pack (TQFP), a small outline (SOIC), a shrink small outline package (SSOP), a thin small outline (TSOP), a system in package (SIP), a multi-chip package (MCP), a wafer-level fabricated package (WFP), or a wafer-level processed stack package (WSP).

Figure 13:
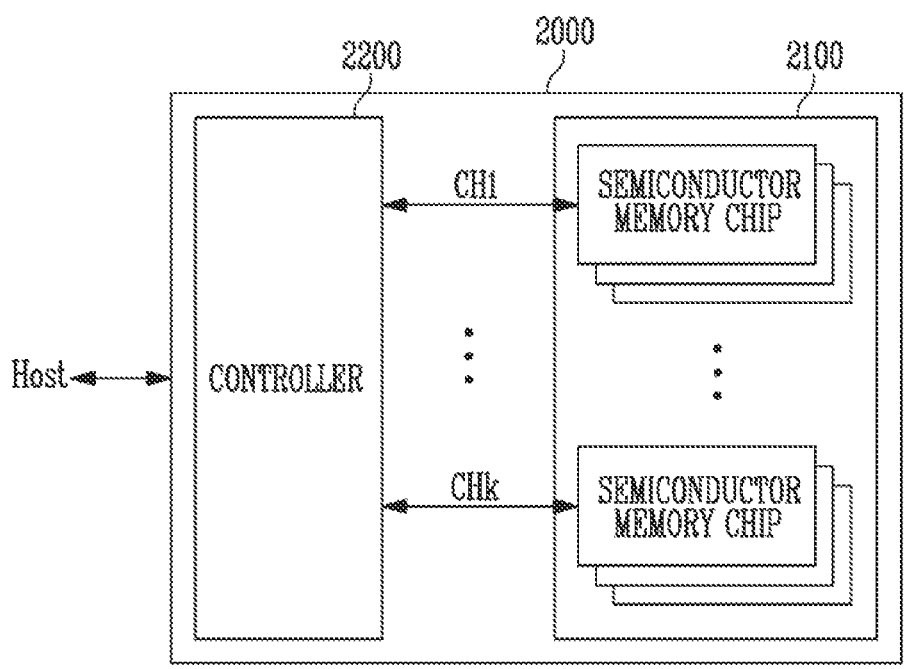
FIG. 13 is a block diagram illustrating an application example of the memory system of FIG. 12.

FIG. 13 is a block diagram illustrating an application example of the memory system 1000 of FIG. 12.

Referring to FIG. 13, a memory system 2000 includes a semiconductor memory device 2100 and a controller 2200. The semiconductor memory device 2100 includes a plurality of semiconductor memory chips. The plurality of semiconductor memory chips are divided into a plurality of groups.

In FIG. 13, the plurality of groups communicate with the controller 2200 through first to k-th channels CH1 to CHk, respectively. Each semiconductor memory chip is configured and is operated similarly to the semiconductor memory device 100 described with reference to FIG. 1.

Each group is configured to communicate with the controller 2200 through one common channel. The controller 2200 is configured similarly to the controller 1100 described with reference to FIG. 12 and is configured to control the plurality of memory chips of the semiconductor memory device 2100 through the plurality of channels CH1 to CHk.

Figure 14:
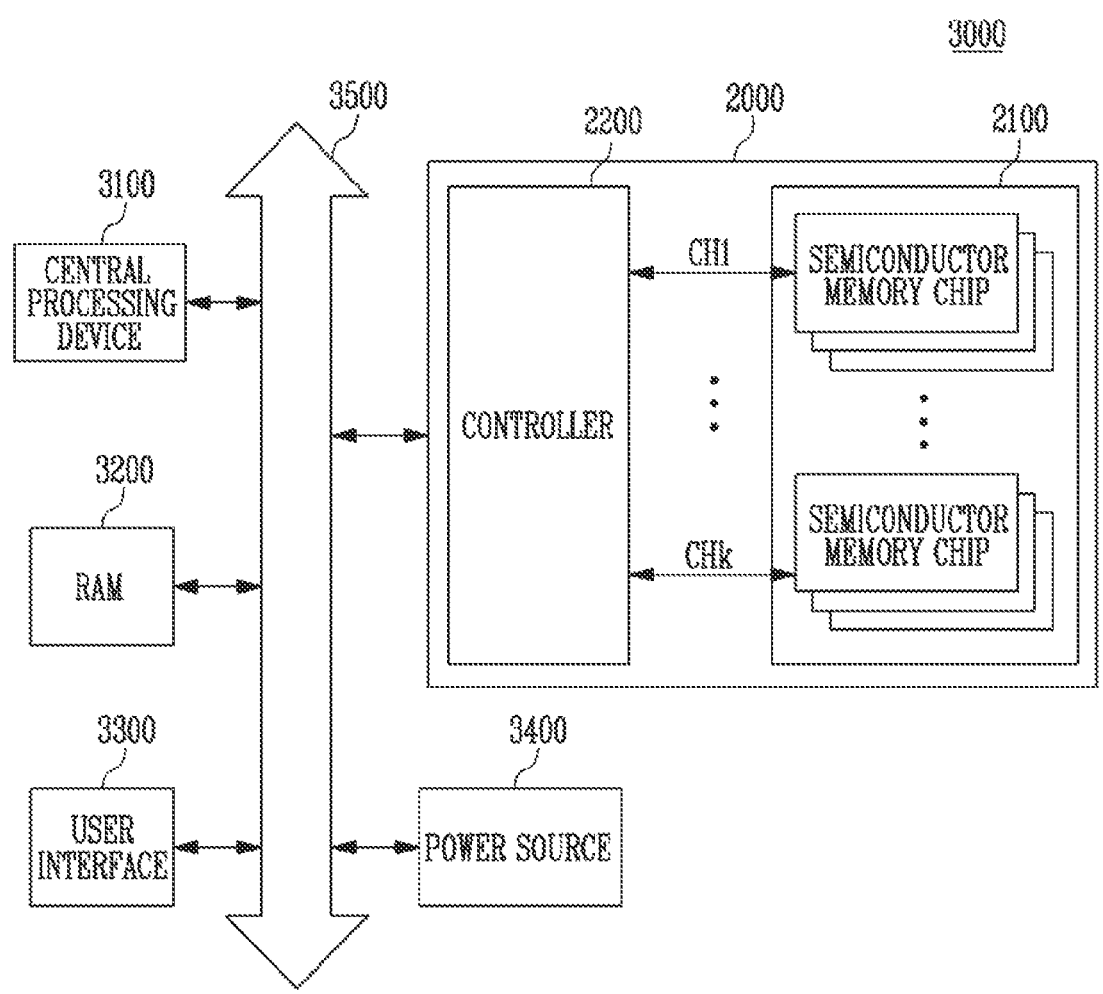
FIG. 14 is a block diagram illustrating a computing system including the memory system described with reference to FIG. 13.

FIG. 14 is a block diagram illustrating a computing system 3000 including the memory system 2000 described with reference to FIG. 13.

The computing system 3000 includes a central processing device 3100, random access memory (RAM) 3200, a user interface 3300, a power source 3400, a system bus 3500, and the memory system 2000.

The memory system 2000 is electrically connected to the central processing device 3100, the RAM 3200, the user interface 3300, and the power source 3400 through the system bus 3500. Data provided through the user interface 3300 or processed by the central processing device 3100 is stored in the memory system 2000.

In FIG. 14, the semiconductor memory device 2100 is connected to the system bus 3500 through the controller 2200. However, the semiconductor memory device 2100 may be configured to be directly connected to the system bus 3500. At this time, a function of the controller 2200 is performed by the central processing device 3100 and the RAM 3200.

In FIG. 14, the memory system 2000 described with reference to FIG. 13 is indicated. However, the memory system 2000 may be replaced with the memory system 1000 described with reference to FIG. 12. In an embodiment, the computing system 3000 may be configured to include both of the memory systems 1000 and 2000 described with reference to FIGS. 12 and 13.

The embodiments of the present disclosure disclosed in the present specification and drawings are merely provided with specific examples to explain the technical content of the present disclosure and to help understanding of the present disclosure, and are not intended to limit the scope of the present disclosure. It will be appreciated by those of ordinary skill in the art that other modified examples based on the technical idea of the present disclosure may be implemented in addition to the embodiments disclosed herein.

What is claimed is:

1. A semiconductor memory device comprising:
a memory block including a plurality of drain select transistors, and a plurality of memory cells to program to a plurality of program states during a program operation;
a voltage generator configured to generate a program voltage and a select line voltage to apply to the memory block during the program operation; and
a read and write circuit configured to apply a program permission voltage or a program inhibition voltage to bit lines of the memory block based on program data, wherein the voltage generator is configured to:
generate the select line voltage as a first select line voltage during a first program operation on some program states among the plurality of program states, and
generate the select line voltage as a second select line voltage for which a potential is lower than a potential of the first select line voltage during a second program operation on remaining program states among the plurality of program states, and
wherein each of the first select line voltage and the second select line voltage is greater than a sum of the program permission voltage and a highest threshold voltage of the plurality of drain select transistors, and is less than a sum of the program inhibition voltage and a lowest threshold voltage of the plurality of drain select transistors.

2. The semiconductor memory device of claim 1, wherein the select line voltage is a voltage applied to a drain select line coupled to the plurality of drain select transistors.

3. The semiconductor memory device of claim 1, wherein:
the first program operation includes a plurality of program loops, and
each of the plurality of program loops includes a program voltage apply operation, a pre-verify operation, and a main verify operation.

4. The semiconductor memory device of claim 3, wherein:
the voltage generator is configured to generate, during the pre-verify operation, a pre-verify voltage and provide the pre-verify voltage to the memory block, and
the read and write circuit is configured to sense a current amount of the bit lines and apply a set bit line voltage to the bit lines based on a sensing result.

5. The semiconductor memory device of claim 4, wherein:
the set bit line voltage is higher than the program permission voltage, and
the set bit line voltage is lower than the program inhibition voltage.

6. The semiconductor memory device of claim 4, wherein the voltage generator is configured to:
generate, during the main verify operation, a main verify voltage higher than the pre-verify voltage, and
provide the main verify voltage to the memory block.

7. The semiconductor memory device of claim 1, wherein:
the second program operation includes a plurality of program loops, and
each of the plurality of program loops includes a program voltage apply operation and a main verify operation.

8. A semiconductor memory device comprising:
a memory block including a plurality of drain select transistors, and a plurality of memory cells programmable to first to n-th program states;
a voltage generator configured to generate a program voltage and a select line voltage to apply to the memory block during a plurality of program operations corresponding to the respective first to n-th program states;
a read and write circuit configured to apply a program permission voltage or a program inhibition voltage to bit lines of the memory block based on program data; and
control logic configured to control the voltage generator and the read and write circuit to sequentially perform the plurality of program operations,
wherein the control logic controls the voltage generator to:
generate the select line voltage as a first select line voltage during a program operation corresponding to the first program state to a specific program state, and
generate the select line voltage as a second select line voltage for which a potential is lower than a potential of the first select line voltage during a program operation corresponding to at least one program state next to the specific program state, and
wherein each of the first select line voltage and the second select line voltage is greater than a sum of the program permission voltage and a highest threshold voltage of the plurality of drain select transistors, and is less than a sum of the program inhibition voltage and a lowest threshold voltage of the plurality of drain select transistors.

9. The semiconductor memory device of claim 8, wherein the select line voltage is a voltage applied to a drain select line coupled to the plurality of drain select transistors.

10. The semiconductor memory device of claim 8, wherein:
the program operation corresponding to the first to specific program states includes a program voltage apply operation, a pre-verify operation, and a main verify operation, and
the program operation corresponding to the at least one program state next to the specific program state includes the program voltage apply operation and the main verify operation.

11. The semiconductor memory device of claim 10, wherein:
the voltage generator is configured to provide, during the pre-verify operation, a pre-verify voltage lower than a main verify voltage to the memory block, and
the read and write circuit is configured to sense a current amount of the bit lines, and apply a set bit line voltage to the bit lines based on a sensing result.

12. The semiconductor memory device of claim 8, wherein the control logic comprises:
ROM configured to generate an internal control signal in response to a command and a pass/fail signal; and
a voltage generation control circuit configured to generate control signals for controlling the voltage generator in response to the internal control signal, and
wherein the pass/fail signal is a signal indicating completion or incompletion of the program operation for the specific program state.

13. The semiconductor memory device of claim 12, wherein the control logic is configured to generate:
the control signals for controlling the voltage generator to generate the first select line voltage, when it is determined that the program operation for the specific program state is incomplete based on the pass/fail signal; and
the control signals for controlling the voltage generator to generate the second select line voltage, when it is determined that the program operation for the specific program state is completed based on the pass/fail signal.

14. The semiconductor memory device of claim 12, wherein the voltage generation control circuit comprises:
a register including information on the first select line voltage and information on the second select line voltage, wherein the register is configured to output the information on the first select line voltage or the information on the second select line voltage in response to the internal control signal; and
a select line voltage controller configured to generate the control signals for controlling the voltage generator to generate the first select line voltage or the second select line voltage based on the information on the first select line voltage or the information on the second select line voltage received from the register.

15. A method of operating a semiconductor memory device, the method comprising:

setting a drain select line voltage, applied to a drain select line coupled to a plurality of drain select transistors included in the semiconductor memory device, to a first drain select line voltage;

sequentially performing a plurality of first program loops corresponding to first to specific program states among first to n-th program states while a program permission voltage or a program inhibition voltage is applied to each of bit lines coupled to memory cells included in the semiconductor memory device;

setting the drain select line voltage to a second drain select line voltage for which a potential is lower than a potential of the first drain select line voltage when a program operation corresponding to the specific program state is completed; and sequentially performing a plurality of second program loops corresponding to a program state next to the specific program state, wherein each of the first drain select line voltage and the second drain select line voltage is greater than a sum of the program permission voltage and a highest threshold voltage of the plurality of drain select transistors, and is less than a sum of the program inhibition voltage and a lowest threshold voltage of the plurality of drain select transistors.

16. The method of claim 15, wherein:
each of the plurality of first program loops includes a program voltage apply operation, a pre-verify operation, and a main verify operation, and
each of the plurality of second program loops includes the program voltage apply operation and the main verify operation.

17. The method of claim 16, wherein the pre-verify operation includes determining whether a threshold voltage of the memory cells is programmed to a pre-level lower than a target level.

18. The method of claim 17, wherein the pre-verify operation includes setting a set bit line voltage higher than the program permission voltage, when the threshold voltage of the memory cells is programmed to the pre-level as a result of the pre-verify operation.

19. The method of claim 16, wherein the first drain select line voltage is applied to the drain select line of a memory block during the program voltage apply operation of each of the plurality of first program loops.

20. The method of claim 16, wherein the second drain select line voltage is applied to the drain select line of the memory block during the program voltage apply operation of each of the plurality of second program loops.

* * * * *